United States Patent [19]

Fisher et al.

[11] 4,339,626

[45] Jul. 13, 1982

[54] SOLAR POND POWER PLANT

[75] Inventors: Gerald M. Fisher, Palo Alto; Henri J. R. Maget, Los Altos, both of Calif.

[73] Assignee: Varian Associates, Inc., Palo Alto, Calif.

[21] Appl. No.: 254,837

[22] Filed: Apr. 16, 1981

[51] Int. Cl.$^3$ .................. H01L 31/04; F03G 7/02
[52] U.S. Cl. .................. 136/248; 136/246; 60/641.8; 60/641.13; 60/641.15; 126/415; 126/416
[58] Field of Search .............. 136/248, 262; 60/641.8, 60/641.13, 641.15; 126/415, 416

[56] References Cited

U.S. PATENT DOCUMENTS

| | | | |
|---|---|---|---|
| 4,002,031 | 1/1977 | Bell | 60/641.15 |
| 4,063,419 | 12/1977 | Garrett | 60/641.8 |
| 4,159,629 | 7/1979 | Korr et al. | 60/641.15 |
| 4,189,922 | 2/1980 | Bellofatto | 60/641.8 |
| 4,214,572 | 7/1980 | Gonder | 126/425 |
| 4,235,221 | 11/1980 | Murphy | 126/415 |
| 4,296,731 | 10/1981 | Cluff | 126/424 |

OTHER PUBLICATIONS

M. Kenward, "New Solar Panel Tracks The Sun", *Electronics Australia*, Nov. 1976, p. 31.
H. J. R. Maget, "High Efficiency GaAs Photovoltaic Solar Systems," *Third European Community Photovoltaic Solar Energy Conference* (1980), pp. 986–990.

*Primary Examiner*—Aaron Weisstuch
*Attorney, Agent, or Firm*—Stanley Z. Cole; Gerald M. Fisher; Norman E. Reitz

[57] ABSTRACT

Method of operation and apparatus for a salt gradient solar pond employing a novel barge carrying a plurality of two axis stabilized high temperature concentrator solar cell arrays including means to control the flow rate of the concentrator solar cell array cooling fluid to optimize power station characteristics.

9 Claims, 5 Drawing Figures

SOLAR POND POWER PLANT

BACKGROUND OF THE INVENTION

Solar ponds employing an increasing salt density layer as a function of depth are known. These ponds ideally employ three zones, an upper convective zone, a middle non-convecting zone, and a lower convective zone. The concentration of salt is lowest at the top region and highest in the lower region. In the middle non-convecting region, the salt concentration increases with depth. The middle zone allows transmission of a portion of solar energy into the lower zone while insulating from the upward conduction of thermal energy as a result of the increasing salt density.

The salt gradient solar pond appears to be cost effective even though its efficiency is very low, i.e., 2% energy recovery overall, because the plant capital costs, maintenance and operating cost forecasts are modest. At this time, it is not known for certain whether the existing pilot projects will be able to be scaled up in size successfully.

There are at least two serious technical concerns in contemplating scaling up a pond facility. The first most serious concern is with the Rankine cycle heat engine operation. In view of the fact that to date the temperatures in the pond lower level have only been able to reach 90° C., the Rankine cycle efficiency is very low, on the order of 8%. Since the Rankine cycle efficiency curve is quite steep in this vicinity, very small temperature changes can cause serious further reduction in efficiency. Temperature losses in the ducts to the engine and/or periods of overcast could lower the pond temperature and because of the sharp slope of the efficiency curve as a function of temperature, the efficiency would be seriously reduced, increasing the cost/watt of the project to a non-breakeven value. A second major problem relates to maintaining the integrity of the brine zones. Water movements such as surface wave action and the pumping of water to the heat exchanger can cause disruption currents causing the salt gradient to be more uniform resulting in upward thermal convection.

SUMMARY OF THE INVENTION

The apparatus and method of this invention provides a means for combining the qualities of a salt gradient solar pond with favorable qualities of a photovoltaic III-V concentrator solar cell array to provide a more efficient collection of available energy to be able to maintain the temperature of the inlet water to the Rankine engine at a level such that it does not fall into the region in which the Rankine cycle efficiency is too low for profitable operation of the facility.

A second aspect of this invention provides a novel means for floating the two axis steerable trackers in the solar pond to reduce bearing load and to enable simultaneous azimuthal steering of a plurality of the two axis trackers and to provide supplemental heat to the solar pond from a heat exchange with the cooling fluid of the concentrator solar cell array, preferably in a manner which does not cause water currents in the pond which disturb the salt gradient.

DESCRIPTION OF THE PREFERRED EMBODIMENT

Figure 1:
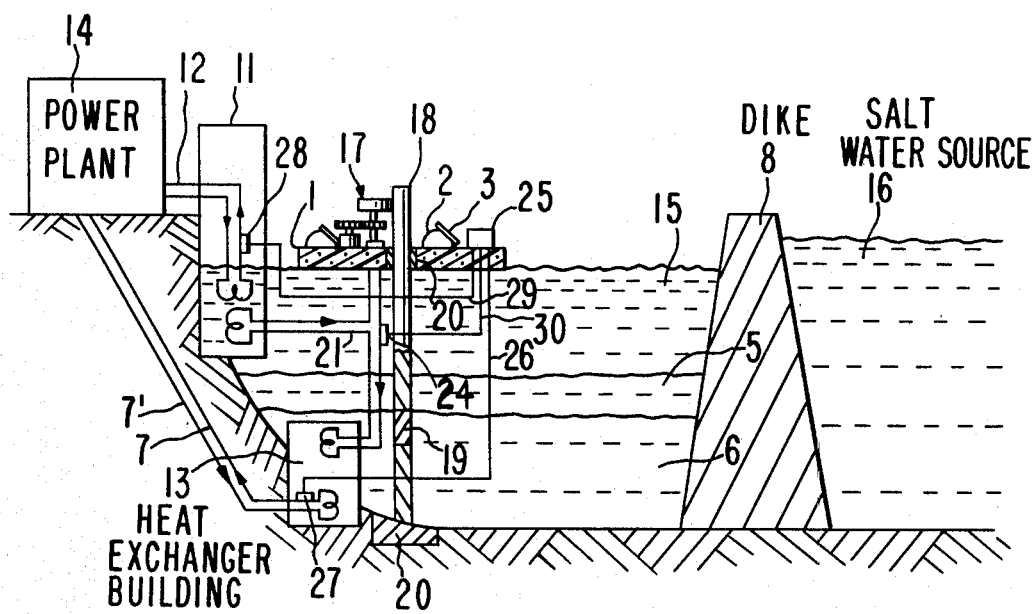
FIG. 1 is a schematic sectional view of a salt gradient solar pond showing a barge containing a plurality of concentrator solar cell panels and the heat exchangers for providing solar heat to the heat engine power plant.
Figure 2:
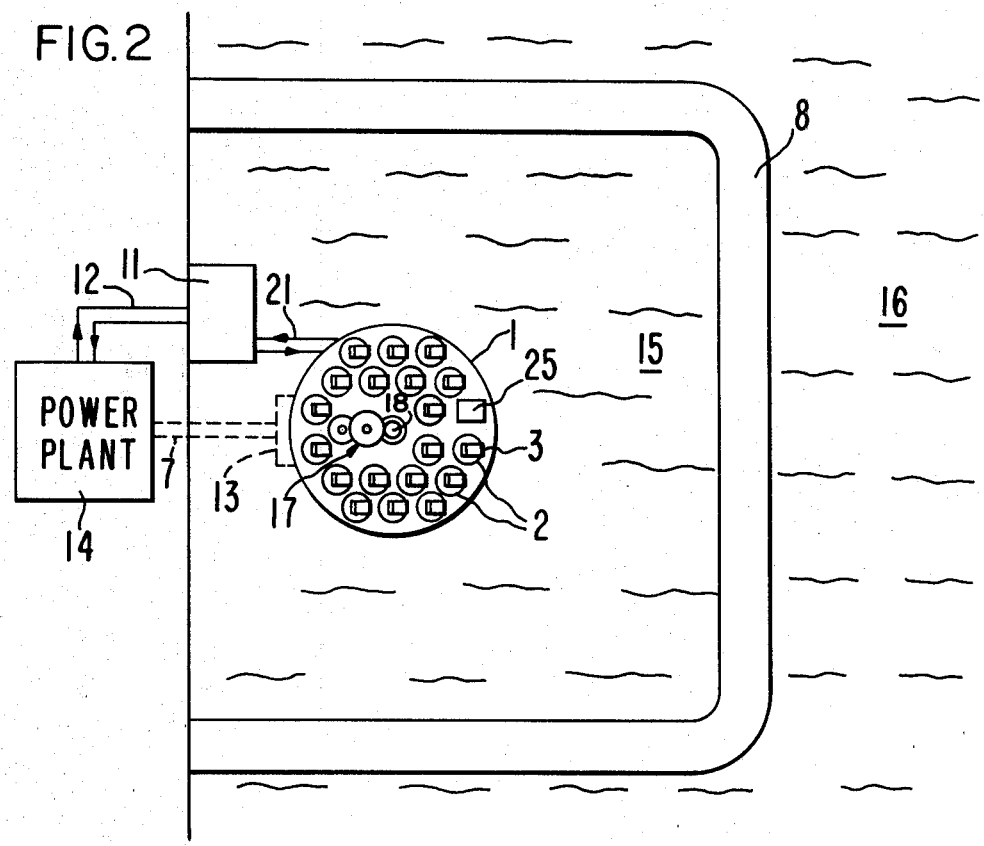
FIG. 2 is a top view of the salt gradient solar pond of FIG. 1.

FIG. 1 shows a polyurethane foam barge 1 supporting a plurality of solar trackers 2, each supporting concentrator solar cell arrays. A heat exchanger is installed in the pond bottom and a fresh water closed loop is employed connecting heat exchanger building 13 to the Rankine cycle engine in the power plant 14. The engine also employs a closed loop fresh water cooling circuit which connects through pipes 12 to heat exchanger housing 11 which is submerged in the colder surface region 15 of the pond. Fresh water from the solar cells cooling loop is also pumped by a pump and controller 25 through a closed loop to heat exchanger building 13 and then to heat exchanger building 11. The higher temperature water from the solar array can be used to increase the temperature of the entrance water to the power plant in pipe 7. The use of closed loop 21 fresh water heat exchanger reduces the overall maintenance problems due to handling hot brine and, most importantly, eliminates introducing water currents which disturb the salt layer distribution of the pond. Preferably, pipes 7 and 7' are large enough to permit human access to the heat exchanger building which is designed to permit in-place maintenance or replacement of the heat exchanger located therein.

Water temperature indicative of the inlet temperature to the heat engine is measured by thermocouple couple 27 in the heat exchanger building 13 and provides a control signal via conductor 26 to the pump and pump controller 25 on the barge. The heat engine cooling water temperature (sink) is indicated by thermocouple 28 and connected via conductor 29 to pump controller 25. Concentrator solar cell array cooling water outlet temperature is indicated by thermocouple 24 and is provided to pump controller 25 via conductor 30.

It is understood that connection of the high temperature portion of the solar cell array cooling water loop to the underwater heat exchanger building is for exemplary purposes only. In fact it may be more efficient to connect the solar cell array high temperature output directly to a separate heat exchanger in the power plant for direct heat exchange relation with the organic working fluid of the heat engine. This may also be preferable from the standpoint of maintenance as well as avoidance of water currents. Since this output temperature will be above the boiling temperature of the brine, boiling and movement of released gases could disturb the salt gradient in the pond.

The dike 8 completely surrounds the pond and provides the means for controlling the pond depth. Preferably a water source 16 is nearby as necessary to provide for evaporation.

Barge 1 is placed around a concrete pillar 18 which is provided with a good footing 20 in the pond bottom. Pillar 18 has a section of light weight insulative concrete 19 or is entirely of such concrete to reduce thermal conduction to the top surface therethrough. The barge 1 is provided with a bearing 20 and a motor and control 17 connected to a friction drive acting on the pillar 19 to control and permit rotation of the entire barge 10 in azimuth with respect to the sun. The friction drive permits the barge to move freely up or down on the pillar with the brine level. This barge configuration permits movement of a massive barge structure containing a large number of concentrator arrays with very little energy due to the fact that the entire barge is being buoyed up by the brine and the fluid friction is very low.

Figure 3:
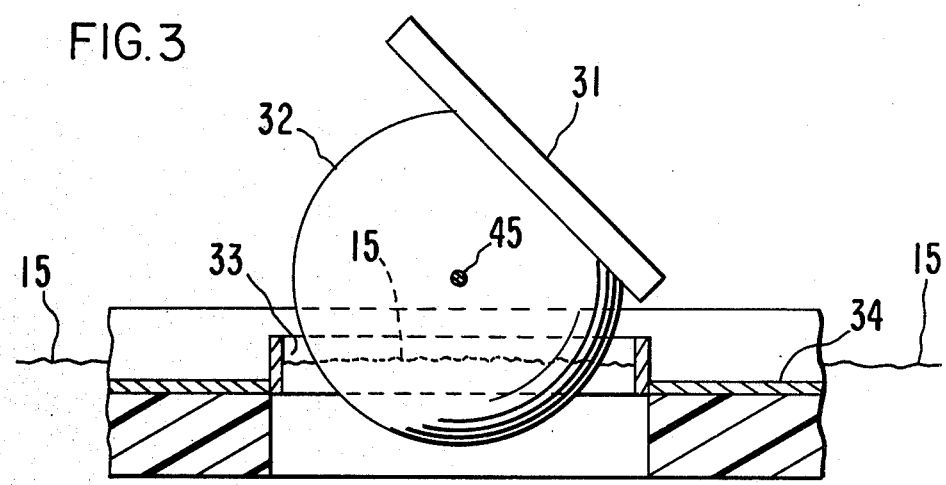
FIG. 3 is a sectional view of the barge showing a sectional view of the concentrator solar cell array mounted on a hollow sphere concentrator mount.
Figure 4:
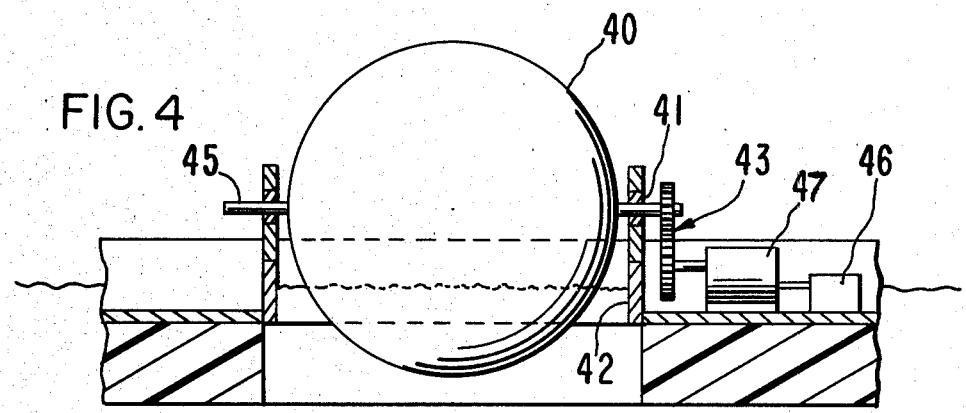
FIG. 4 is a front sectional view of the hollow sphere mount of FIG. 3.

FIG. 3 is a structural schematic of a side view of a concentrator solar cell array 31 mounted on a glass reinforced concrete hollow sphere concentrator mount 32. The barge structure has apertures 33 in its floor 34 through which the concrete mount is lowered. The height of the bearing 41, FIG. 4, is adjusted so that almost all the weight of the concentrator and mount are directly buoyed up by the brine reducing the load on the bearing 41. A frame 42 is built up around apertures 33 to preclude the brine from entering into the barge floor. The floor 34 of the barge contains a motor 47 and gear train/pully assembly 43 to drive the elevation axle 45 of the concentrator mount. Since each of the arrays must be driven in elevation to the same angle, it is also envisioned that further cost savings are possible by connecting a plurality of elevation drives to a single drive motor and controller 46.

The concentrator solar cell array 31 may be of any type but preferably involves an active photocell made from materials from the III and V columns of the periodic table. These are known as III-V photovoltaic cells and the currently preferred cell is gallium arsenide. The GaAs cells have the ability to produce electrical energy at reasonable efficiency, such as 15%, for junction temperatures as high as 175° C. Silicon cells cannot function efficiently at elevated temperatures. This high temperature characteristic of the III-V photocell permits a large range of useful temperature variation of the output water from the concentrator. The solar cell junction temperature, $T_j$ impacts a packaged cell efficiency for GaAs as follows:

$$n = 0.21 - 3.5 \times 10^{-4}(T_j - 50).$$

Therefore at 90° C., the efficiency $n \approx 20\%$. This is the order of the lowest temperature at which the photocell cooling fluid would operate in this system assuming that the bottom zone of the solar pond reaches 85° C. In any event, the cooling fluid from the photovoltaic system must not be maintained at a lower temperature than the pond bottom zone if the thermal energy is being used from the array to improve the Rankine cycle efficiency.

Figure 5:
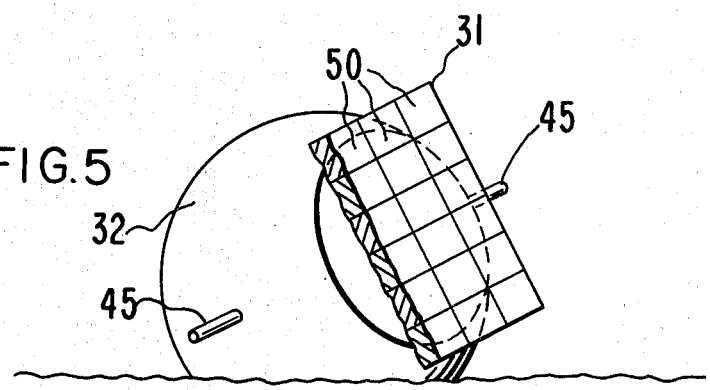
FIG. 5 is a perspective view of the concentrator array panels as supported by the concentrator mount.

FIG. 5 is a prospective view of the hollow sphere tracker. This is preferably made from a brine resistant lightweight hollow concrete shell and can be cast at the site of installation. This figure illustrates the flat surface on one side of the sphere for mounting the array of solar cells. The panels 50 forming the array will preferably extend beyond the sides of the sphere to collect as much as possible of the insolation on the barge. It is particularly advantageous from a cost standpoint to float the plurality of array mounts directly in the brine through apertures in a single rotatable barge. First, this configuration eliminates the cost associated with a base assembly for each mount and reduces the azimuth drive costs per unit because only one azimuth drive is required for the entire barge. Also, by floating each mount, very low forces are supported by the elevation bearing 41, which directly reduces the barge expense.

With respect to the relative sizes of the azimuth drive assembly 17 to the pillar 18, on FIG. 1, they are shown out of proportion for illustrative purposes. It is also understood that the azimuth and elevation solar tracking accuracy is rather stringent, which will require an appropriate drive ratio to provide drive resolution to satisfy the pointing accuracy requirements.

The following table provides a comparison of the total electrical energy per $Km^2$ available from a solar pond with and without solar concentrator solar cell array in place.

TABLE I

| | Solar Pond Only W/O Obscuration | Solar Pond With Obsc. | Solar Pond Plus Concentrator Solar cell array | |
|---|---|---|---|---|
| | | | Tracker Thermal | Tracker Photov. |
| Daily ave. insolation watts/m² | 230 | 230 | 230 | 230 |
| Energy Incident × 10⁻⁶ kWH/Km²-yr | 2000 | 2000 | 2000 | 2000 |
| Area utilization, % | 100 | 80 | 20 | 20 |
| Effective Area, %* | | | 14 | 14 |
| Thermal Energy Incident × 10⁻⁶ kWH/Km²-yr | 2000 | 1600 | 280 | |
| Collection Efficiency, % | 18 | 18 | 40 | 20 |
| Thermal Yield × 10⁻⁶ kWh/Km²-yr | | 288 | 112 | |
| | 360 | | 400 | |
| Rankine Mechanical Gross electrical yield, % | 8.3 | 9.5 | 9.5 | |
| Electrical output × 10⁻⁶ kWH/Km²-yr | 30 | 27.3 | 10.6 | 56 |
| Net yield, % | 80 | 80 | 90 | 100 |
| Net Elect. Output × 10⁻⁶ kWH/Km²-yr | 24 | 21.8 | 9.54 | 56 |
| Total Elect. Output × 10⁻⁶ | 24 | | 87.3 | |

TABLE I-continued

|  | Solar Pond Only W/O Obscuration | Solar Pond With Obsc. | Solar Pond Plus Concentrator Solar cell array | |
|---|---|---|---|---|
|  |  |  | Tracker Thermal | Tracker Photov. |
| kWH/Km²-yr |  |  |  |  |

*Assumes 70% of the insolation on the barge is collected by the concentrators as can be provided by tangential circular concentrators.

Table I demonstrates the significant improvement in overall power output from a salt pond if a solar concentrator array covering 20% of the pond is combined therewith. The total available power output is increased from the same area by a factor of 87.3/24. The table also shows an increase in efficiency of the Rankine engine brought about by the rise in the temperature of the inlet water to the engine. Since the concentrator solar cell array provides a higher temperature to the heat exchanger than the bottom zone of the pond and also provides more energy for the same area, it is assured that an improvement in Rankine efficiency is possible. For the same surface area, the increase in thermal energy obtained from the concentrator solar cell array is shown as $$\frac{(400 - 360)100}{360} = 11.1\%.$$

Although this is a modest percentage, it is a significant increase because of the effect it has on providing some small additional safeguard that the Rankine engine efficiency remains acceptable. Also, it is possible by adjusting the flow rate of the cooling water in conduit 21 of the array to vary the efficiency of the Rankine cycle engine and the photovoltaic system. The photovoltaic array efficiency decreases as a function of temperature and the Rankine cycle engine efficiency increases as a function of temperature. Accordingly, it is possible to implement a control system which optimizes the output power or the efficiency of the solar pond/concentrator total system by controlling the flow rate of the fluid in the concentrator array 21.

It is envisioned that upon completion of the power facility installation, a series of tests would be performed to measure the efficiency of the solar pond/heat engine system and concentrator solar cell efficiency as a function of pond water temperatures and concentrator cooling water temperatures. These results could be embodied in the pump controller 25 or in a computer program therein to provide a means to determine when to increase or decrease the array flow rate.

It is of interest to note that the pond storage of heat is enhanced by the floating polyurethane barge because of its surface insulation effect. In fact, since more thermal energy is captured by the concentrator array/unit area and less energy is dissipated by the insulated portions of the pond, it is clear that the facility would be more efficient and more power/unit area would be available as the area covered by concentrator arrays increased. This is significant because it permits a relatively modest cost method of significantly increasing the capacity of the facility.

We claim:

1. A power station comprising a salt gradient pond, a heat engine, and a plurality of III-V photovoltaic concentrator solar cells;
   means for utilizing the thermal energy available from the lower zone of said salt gradient pond to power said heat engine;
   means for concentrating solar insolation upon said plurality of III-V photovoltaic concentrator solar cells;
   means for cooling said plurality of solar cells and for combining the heat derived from said cells by said cooling means with the heat from said lower zone of said pond for powering said heat engine, said means for cooling said solar cells being a closed loop fluid path;
   means for adjusting the flow rate of the solar cell cooling fluid in said closed loop fluid path to optimize power station operating characteristics.

2. The pond of claim 1 wherein said means for adjusting the flow rate of said solar cell cooling fluid is responsive to an indication of the temperature at the inlet to said heat engine.

3. A salt gradient solar pond comprising an enclosed body of brine solution having three zones of salt concentration, the topmost zone having the lowest concentration, the middle zone having a salt concentration increasing with depth and the lowermost zone having the highest concentration;
   a platform means for supporting a plurality of photovoltaic concentrator solar cell arrays being floated in said top zone of said brine solution;
   means for rotating said platform in azimuth as a function of the position of the sun;
   means for utilizing the thermal energy available from the solar pond to power a heat engine, said solar pond thermal energy including thermal energy derived from the cooling of said concentrator solar cell arrays.

4. The pond of claim 3 wherein the platform is slideable vertically in response to the level of the brine.

5. The solar pond of claim 3 wherein said means for rotating said platform in azimuth comprises an axle through the platform about which said platform is controllably drivable and power drive means on said platform for applying torque to said axle.

6. The pond of claim 3 further comprising fluid means for cooling said concentrator solar cell arrays and means for deriving thermal energy therefrom, and means for adjusting the flow rate of said fluid means for cooling to optimize combined pond and concentrator operating characteristics.

7. A photovoltaic concentrator solar cell system for floating on a brine gradient solar pond comprising,
   a plurality of concentrator solar cell mounting means, said concentrator mounting means being buoyant in said brine, said concentrator mounting means including an elevation axis;

a barge, said barge being buoyant in said brine, said barge having a plurality of openings for receiving said concentrator solar cell mounting means, said barge further including means for precluding azimuth relative motion between said concentrator solar cell mounting means and said barge while permitting elevation rotational motion of said concentrator solar cell mounting means relative to said barge means about said elevation axis; and means for inducing relative azimuthal rotation between said barge and said brine.

8. The system of claim 7 wherein said means to induce relative azimuthal rotation includes a centrally located opening through said barge for receiving an axle and drive means for moving said barge about said axle.

9. A method for operating a power plant comprising a salt gradient solar pond employing a heat engine in conjunction with a photovoltaic concentrator solar cell array mounted on a barge floated in said pond, said method comprising:

measuring a temperature representative of the temperature difference between the heat source temperature at the inlet to said heat engine receiving heat from the lower level of said salt pond and the heat sink inlet to the heat engine from the cooler;

combining heat derived from the cooling of concentrator solar cell array with the heat available from said pond and using said combined heat to raise the temperature of the working fluid for said heat engine; and adjusting the rate of flow of a cooling fluid for said concentrator solar cell array responsive to said temperature measurement in order to control the rate at which heat from said concentrator solar cell array is combined with heat available from said pond.

* * * * *